United States Patent
Kadota et al.

(10) Patent No.: US 10,186,980 B2
(45) Date of Patent: Jan. 22, 2019

(54) POWER CONVERSION DEVICE WITH STAGGERED POWER SEMICONDUCTOR MODULES

(71) Applicant: FUJI ELECTRIC CO., LTD., Kawasaki (JP)

(72) Inventors: Yasunobu Kadota, Tokyo (JP); Yasuaki Furusho, Kobe (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 15/712,592

(22) Filed: Sep. 22, 2017

(65) Prior Publication Data

US 2018/0145604 A1 May 24, 2018

(30) Foreign Application Priority Data

Nov. 24, 2016 (JP) ................. 2016-228092

(51) Int. Cl.
*H02M 7/00* (2006.01)
*H02M 7/483* (2007.01)
(Continued)

(52) U.S. Cl.
CPC ........ *H02M 7/003* (2013.01); *H01L 23/3672* (2013.01); *H01L 23/50* (2013.01); *H01L 25/072* (2013.01); *H02M 7/483* (2013.01); *H02M 7/537* (2013.01); *H05K 7/209* (2013.01); *H01L 23/367* (2013.01); *H01L 23/3736* (2013.01); *H01L 29/1608* (2013.01); *H01L 29/2003* (2013.01); *H01L 29/7393* (2013.01); *H01L 29/747* (2013.01)

(58) Field of Classification Search
CPC ... H02M 7/537; H02M 7/003; H01L 23/3672; H01L 23/50; H01L 25/072; H05K 7/209
See application file for complete search history.

(56) References Cited

U.S. PATENT DOCUMENTS

| 8,649,197 B2 * | 2/2014 | Abe ............... | H02M 7/487 363/132 |
| 8,861,240 B2 * | 10/2014 | Yoshikawa ....... | H02M 7/537 363/132 |

(Continued)

FOREIGN PATENT DOCUMENTS

JP 2014-36509 2/2014

*Primary Examiner* — Emily P Pham

(57) ABSTRACT

A power conversion device includes: a plurality of first power semiconductor modules in each of which a series circuit of a first semiconductor device and a second semiconductor device is built in, each of the plurality of first power semiconductor modules being connected in parallel with a series circuit of a first capacitor and a second capacitor connected in series with a DC power source; and a plurality of second power semiconductor module in each of which a bidirectional semiconductor device is built in, the bidirectional semiconductor device being connected between a connection point between the first capacitor and the second capacitor and one of connection points between the first semiconductor devices and the second semiconductor devices. Each of the first power semiconductor modules and the second power semiconductor modules are arranged on a mounting surface of a cooling body in a staggered arrangement.

12 Claims, 14 Drawing Sheets

(51) Int. Cl.
*H01L 23/367* (2006.01)
*H01L 23/50* (2006.01)
*H01L 25/07* (2006.01)
*H02M 7/537* (2006.01)
*H05K 7/20* (2006.01)
*H01L 29/16* (2006.01)
*H01L 29/20* (2006.01)
*H01L 29/739* (2006.01)
*H01L 29/747* (2006.01)
*H01L 23/373* (2006.01)

(56) References Cited

U.S. PATENT DOCUMENTS

| | | | | |
|---|---|---|---|---|
| 9,735,705 | B2* | 8/2017 | Banno | H02M 5/4585 |
| 2004/0246756 | A1* | 12/2004 | Bijlenga | H02M 7/487 |
| | | | | 363/132 |
| 2010/0039843 | A1* | 2/2010 | Takizawa | H02M 7/487 |
| | | | | 363/131 |
| 2011/0116293 | A1* | 5/2011 | Tabata | H02M 7/487 |
| | | | | 363/132 |
| 2011/0222325 | A1* | 9/2011 | Komatsu | H02M 7/487 |
| | | | | 363/127 |
| 2012/0092915 | A1* | 4/2012 | Okuda | H02M 7/487 |
| | | | | 363/132 |

* cited by examiner

POWER CONVERSION DEVICE WITH STAGGERED POWER SEMICONDUCTOR MODULES

CROSS REFERENCE TO RELATED APPLICATIONS AND INCORPORATION BY REFERENCE

This application claims benefit of priority under 35 USC 119 based on Japanese Patent Application No. 2016-228092 filed on Nov. 24, 2016, the entire contents of which are incorporated by reference herein.

TECHNICAL FIELD

The present invention relates to a power conversion device that is constituted by connecting a plurality of power semiconductor modules that have different internal element configurations.

BACKGROUND ART

As a power conversion device of this type, for example, a three-level power conversion device that is constituted by constituting a power conversion circuit for one phase and including such power conversion circuits for three phases has been proposed (see, for example, JP 2014-36509 A). In the above, the power conversion circuit for one phase is constituted with a 2-in-1 module that is constituted by connecting, in series, a first IGBT to which a flyback diode is connected in inverse parallel and a second IGBT to which a flyback diode is likewise connected in inverse parallel and containing the connected IGBTs in one package and a bidirectional switch module that contains, in a package, a bidirectional switch, which has a characteristic of allowing a current to flow in both directions.

In the conventional art described in JP 2014-36509 A, on a cooling fin, a first region in which three 2-in-1 modules are arranged in parallel and a second region in which three bidirectional switch modules are arranged in parallel are formed. The respective 2-in-1 modules and bidirectional switch modules and capacitors are electrically interconnected by a laminated bus bar.

SUMMARY OF INVENTION

In the conventional art described in JP 2014-36509 A, on the cooling fin, a region for arranging the 2-in-1 modules, in each of which a first IGBT and a second IGBT are built in, in parallel and a region for arranging the bidirectional switch modules, in each of which a bidirectional switch element is built in, in parallel are formed in a divided manner. In the above, in a 2-in-1 module, a first IGBT and second IGBT in which element loss increases when a device power factor is close to 1 are built in, and, in a bidirectional switch module, a bidirectional switch element in which element loss increases when the device power factor is close to 0 is built in.

Therefore, there is a problem in that, since, in both cases of a high device power factor and a low device power factor, elements the loss of which becomes high are arranged in a concentrated manner to either the divided first region or second region on the cooling fin, the cooling fin cannot exert sufficient cooling capability.

It has been well known that, in a power conversion device, a surge voltage is generated across a switch element in accordance with a current change rate and a wiring parasitic inductance in performing switching.

When a switching operation is speeded up in order to reduce element loss, a problem is caused in that a surge voltage in performing the switching operation increases in proportion to an increase in the time rate of change in a main circuit current and a required withstand voltage of a switching element increases.

Although reducing the wiring parasitic inductance by increasing the packaging density of 2-in-1 modules and bidirectional switch modules on a cooling fin is applicable, another problem is caused in that heat generation density increases.

Accordingly, the present invention is made by taking notice of such problems in the above-described conventional art, and an object of the present invention is to provide a power conversion device that is capable of not only increasing cooling efficiency but also reducing wiring parasitic inductance in connecting a plurality of modules that have different internal element configurations in parallel.

In order to achieve the object mentioned above, according to an aspect of the present invention, there is provided a power conversion device including: a plurality of first power semiconductor modules in each of which a series circuit of a first semiconductor device and a second semiconductor device is built in, each of the plurality of first power semiconductor modules being connected in parallel with a series circuit of a first capacitor and a second capacitor connected in series with a DC power source; and a plurality of second power semiconductor module in each of which a bidirectional semiconductor device is built in, the bidirectional semiconductor device being connected between a connection point between the first capacitor and the second capacitor and one of connection points between the first semiconductor devices and the second semiconductor devices. Each of the first power semiconductor modules and the second power semiconductor modules are arranged on a mounting surface of a cooling body in a staggered arrangement.

According to one aspect of the present invention, since 2-in-1 type first power semiconductor modules and second power semiconductor modules in each of which a bidirectional switch element is built in are arranged in a staggered arrangement on a mounting surface of a cooling body, heat generation regions on the mounting surface of the cooling body may be dispersed, and thus cooling efficiency of the first power semiconductor modules and the second power semiconductor modules by the cooling body may be improved. In addition, since a first power semiconductor module and a second power semiconductor module that are arranged in parallel with each other can be electrically interconnected, wiring parasitic inductance may be reduced.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 5A is a perspective view illustrative of an overall structure of the laminated bus bar, FIG. 5B is an exploded perspective view of the laminated bus bar;

DETAILED DESCRIPTION

Embodiments of the present invention will now be described with reference to the drawings. In the following description of the drawings, the same or similar reference signs are assigned to the same or similar portions. However, it should be noted that the drawings are schematic and relations between thicknesses and planar dimensions, ratios among thicknesses of respective layers, and the like are different from actual ones. Therefore, specific thicknesses and dimensions should be determined in consideration of the following description. It should also be noted that the drawings include portions having different dimensional relationships and ratios from each other.

In addition, the following embodiment indicates devices and methods to embody the technical idea of the present invention by way of example, and the technical idea of the present invention does not limit the materials, shapes, structures, arrangements, and the like of the constituent components to those described below. The technical idea of the present invention can be subjected to a variety of alterations within the technical scope prescribed by the claims described in CLAIMS.

First, an embodiment of a power conversion device that represents one aspect of the present invention will be described.

First, a first power semiconductor module PM1 and a second power semiconductor module PM2 to which the present invention is applicable will be described.

Figure 6:
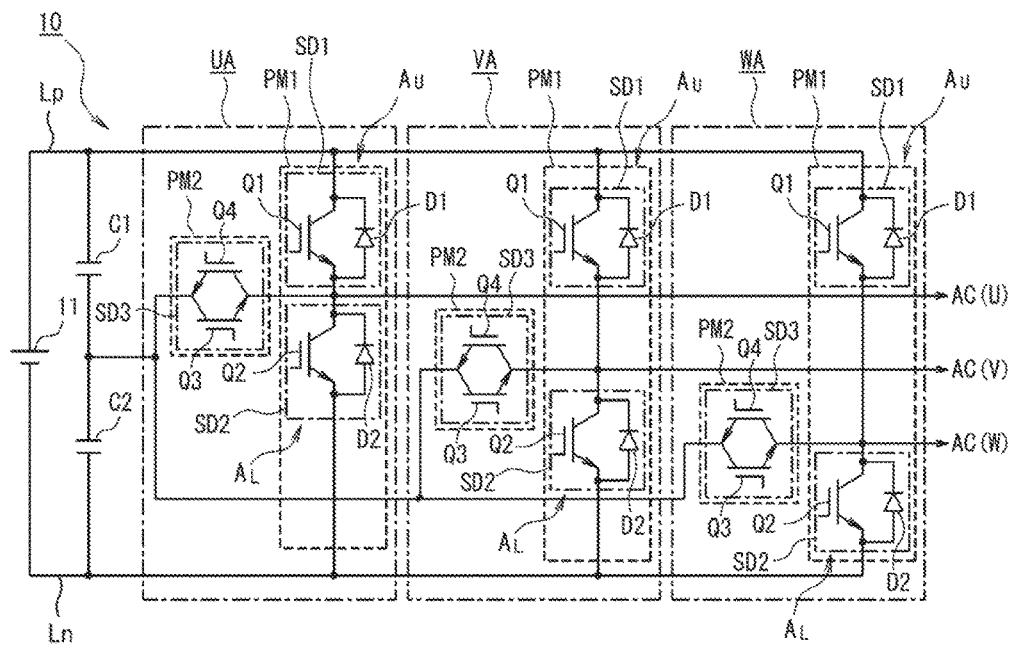
FIG. 6 is a circuit diagram illustrative of an equivalent circuit of FIG. 1.

As illustrated in FIG. 6, a first power semiconductor module PM1 is constituted with a 2-in-1 module that is constituted by connecting, in series, a first semiconductor device SD1 that constitutes an upper arm $A_U$ and a second semiconductor device SD2 that constitutes a lower arm $A_L$. In the above, the first semiconductor device SD1 is constituted with a semiconductor switching element Q1 that is made of an insulated gate bipolar transistor (IGBT), a power MOSFET, and the like and a flyback diode D1 that is connected in inverse parallel with the switching element Q1.

In a similar manner, a second semiconductor device SD2 is also constituted with a switching element Q2 that is made of an insulated gate bipolar transistor (IGBT), a power MOSFET, and the like and a flyback diode D2 that is connected in inverse parallel with the switching element Q2.

Figure 1:
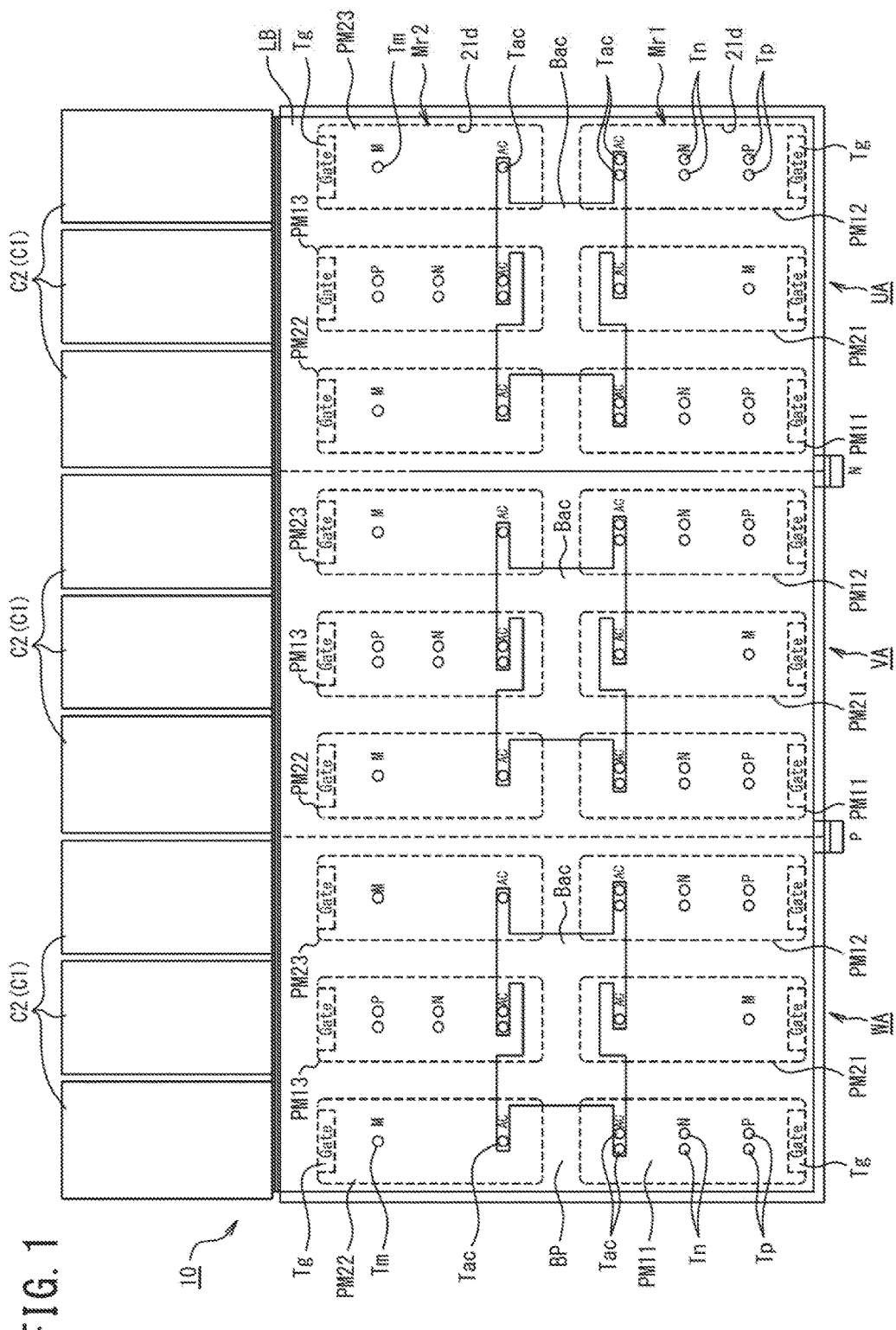
FIG. 1 is a plan view illustrative of a first embodiment of a power conversion device according to the present invention.
Figure 2:
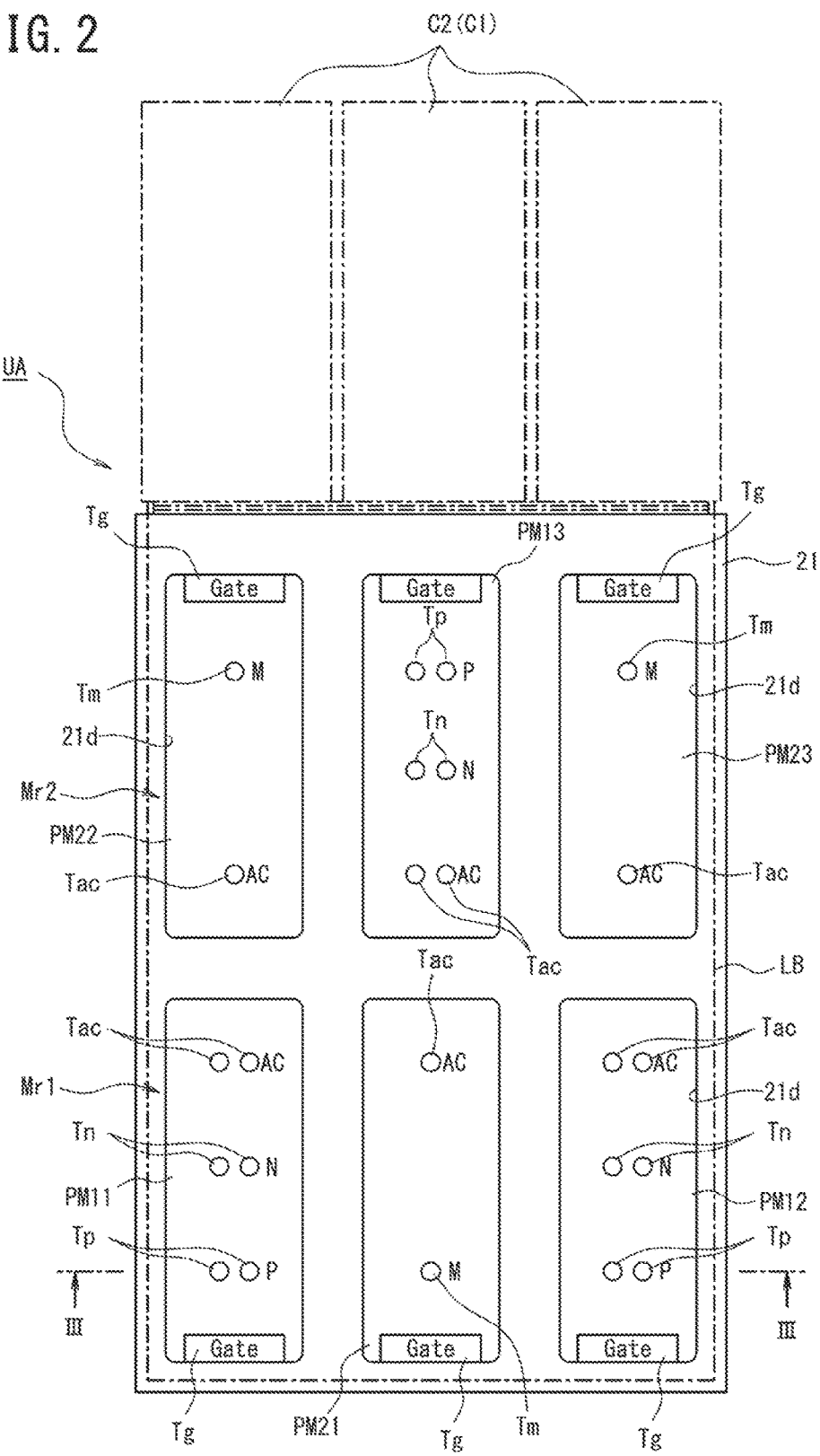
FIG. 2 is an enlarged plan view illustrative of a U-phase output arm.
Figure 3:
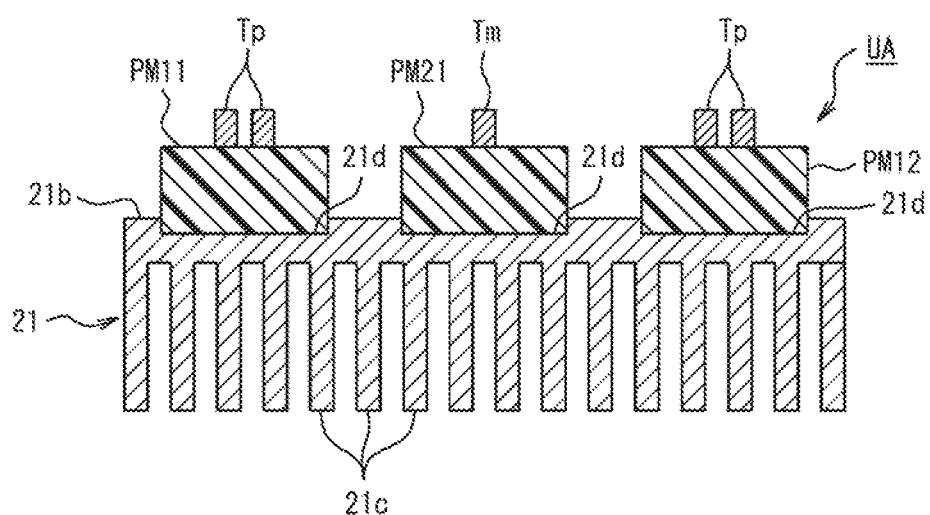
FIG. 3 is a cross-sectional view taken along the line III-III in FIG. 2.

As illustrated in FIGS. 1 to 3, the first power semiconductor module PM1 is formed into an in-mold molded article in which the afore-described first semiconductor device SD1 and second semiconductor device SD2 and a wiring board (not illustrated) that connects them electrically are covered with molding resin.

On the front surface of the first power semiconductor module PM1, a pair of pin-shaped positive electrode terminals Tp that are connected to a positive electrode of a DC power source, a pair of negative electrode terminals Tn that are connected to a negative electrode of the DC power source, and a pair of AC output terminals Tac that are connected to a load are arranged in this order from one end side toward the other end side with an identical inter-terminal distance kept therebetween.

Furthermore, a gate terminal Tg through which gate signals are supplied to the first semiconductor device SD1 and the second semiconductor device SD2, respectively, is formed on the opposite side of the positive electrode terminals Tp to the negative electrode terminals Tn. In the above, each of the pair of positive electrode terminals Tp, the pair of negative electrode terminals Tn, and the pair of AC output terminals Tac is made up of two pin-shaped terminals that are formed projectingly with a prescribed distance kept therebetween in the width direction.

As illustrated in FIG. 6, the second power semiconductor module PM2 is constituted with a bidirectional semiconductor device SD3 in which two reverse blocking IGBTs Q3 and Q4 are connected in inverse parallel with each other. As illustrated in FIGS. 1 to 3, the second power semiconductor module PM2 is formed into an in-mold molded article in which the reverse blocking IGBTs Q3 and Q4 and a wiring board that connects them electrically are covered with molding resin.

On the front surface of the second power semiconductor module PM2, a middle terminal Tm is formed projectingly on one end side, the AC output terminal Tac is formed projectingly on the other end side, and the gate terminal Tg that supplies gate signals to the reverse blocking IGBTs Q3 and Q4, respectively, is formed projectingly on the opposite side of the middle terminal Tm to the AC output terminal Tac. In the above, each of the middle terminal Tm and the AC output terminal Tac is made up of a pin-shaped terminal that is formed projectingly in the center in the width direction.

The first power semiconductor module PM1 and the second power semiconductor module PM2 are formed in the same size, and the middle terminal Tm and the output terminal Tac of the second power semiconductor module PM2 are formed at positions corresponding to the positive electrode terminals Tp and the output terminals Tac of the first power semiconductor module PM1, respectively.

On the back surfaces of the first power semiconductor module PM1 and the second power semiconductor module PM2, heatsinks that dissipate generated heat from internal semiconductor devices to the outside are preferably arranged.

Next, a three-level three-phase power conversion device that is constituted using first power semiconductor modules PM1 and second power semiconductor modules PM2 will be described.

As illustrated in FIG. 6, a three-level three-phase power conversion device 10 described above includes a series circuit made up of a first capacitor C1 and a second capacitor C2, a U-phase output arm UA, a V-phase output arm VA, and a W-phase output arm WA that are connected in parallel between a positive electrode line Lp that is connected to the positive electrode of a DC power source 11 and a negative electrode line Ln that is connected to the negative electrode of the DC power source 11.

As illustrated in FIG. 6, a basic configuration of each of the U-phase output arm UA, the V-phase output arm VA, and the W-phase output arm WA includes a pair of a first power semiconductor module PM1 and a second power semiconductor module PM2.

That is, the first power semiconductor module PM1 has a first semiconductor device SD1 and a second semiconductor device SD2 connected between the positive electrode line Lp and the negative electrode line Ln. The second power semiconductor module PM2 has a bidirectional semiconductor device SD3 connected between a connection point between the first semiconductor device SD1 and the second semiconductor device SD2 and a connection point between the first capacitor C1 and the second capacitor C2.

Figure 7:
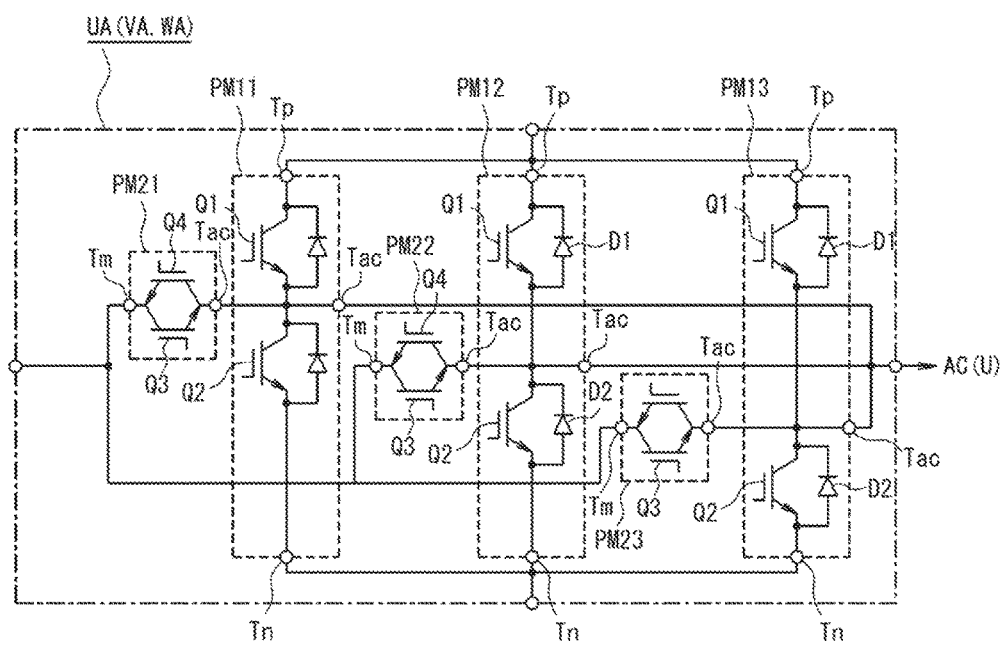
FIG. 7 is a circuit diagram illustrative of an equivalent circuit of a U-phase output arm in FIG. 6.

In addition, as illustrated in FIG. 7, each of the U-phase output arm UA, the V-phase output arm VA, and the W-phase output arm WA has a configuration in which a plurality of, for example, three, pairs of a first power semiconductor module PM1 and a second power semiconductor module PM2 are connected in parallel in order to acquire a required load current when a pair of a first power semiconductor module PM1 and a second power semiconductor module PM2 is incapable of supplying a sufficient load current required for a load.

When, as described above, each of the U-phase output arm UA, the V-phase output arm VA, and the W-phase output arm WA is constituted using a plurality of pairs of a first power semiconductor module PM1 and a second power semiconductor module PM2, three sets of first power semiconductor modules PM11 to PM13 and second power semiconductor modules PM21 to PM23 are arranged on cooling bodies 21 that are constituted with cooling fins or cooling pins, as illustrated in FIG. 1.

In the above, each cooling body 21 is formed of a metal member, such as aluminum and copper, having a high thermal conductivity. The cooling body 21 is constituted with a module mounting plate section 21a and a lot of heat dissipation fins 21c that are formed in a downward projecting manner on the opposite side of the module mounting plate section 21a to a module mounting surface 21b thereof.

As illustrated in FIG. 3, on the module mounting surface 21b of each module mounting plate section 21a, three recessed sections 21d, each of which has a shallow depth and is to position a power semiconductor module out of the three sets of the first power semiconductor modules PM11 to PM13 and the second power semiconductor modules PM21 to PM23, in the right and left directions in each of two rows, front and rear, that is, six recessed sections 21d in total, are formed.

As illustrated in FIG. 2 in an enlarged manner, in the U-phase output arm UA, the first power semiconductor module PM11, the second power semiconductor module PM21, and the first power semiconductor module PM12 are arranged in parallel with one another in this order from the left into recessed sections 21d in the front row in such a way that side surfaces of each pair of adjacent modules face each other with a prescribed distance kept therebetween to constitute a first module row Mr1.

In addition, into recessed sections 21d in the rear row, the second power semiconductor module PM22, the first power semiconductor module PM13, and the second power semiconductor module PM23 are arranged in parallel with one another in this order from the left in such a way that side surfaces of each pair of adjacent modules face each other with a prescribed distance kept therebetween to constitute a second module row Mr2.

In the above, the first power semiconductor modules PM11 and PM12 in the first module row Mr1 are arranged in such a way that the gate terminals Tg thereof and the AC output terminals Tac thereof are positioned on the front end side and on the rear end side, respectively. In addition, the second power semiconductor module PM21 in the first module row Mr1 is arranged in such a way that the gate terminal thereof and the AC output terminal Tac thereof are positioned on the front end side and on the rear end side, respectively.

The first power semiconductor module PM13 in the second module row Mr2 is arranged in such a way that the gate terminals Tg thereof and the AC output terminals Tac thereof are positioned on the rear end side and on the front end side, respectively. In addition, the second power semiconductor modules PM22 and PM23 in the second module row Mr2 are arranged in such a way that the gate terminals Tg thereof and the AC output terminal Tac thereof are positioned on the rear end side and on the front end side, respectively.

Therefore, on the module mounting plate section 21a of the cooling body 21, the first power semiconductor modules PM11 to PM13 and the second power semiconductor modules PM21 to PM23 are arranged in an alternate manner in the planar view, that is, in a staggered arrangement, so that the first power semiconductor modules PM11 to PM13 and the second power semiconductor modules PM21 to PM23 face each other in the front and rear directions.

The V-phase output arm VA and the W-phase output arm WA also include first module rows Mr1 and second module rows Mr2 that have the same arrangements as those of the U-phase output arm UA, and the first power semiconductor modules PM11 to PM13 and the second power semiconductor modules PM21 to PM23 are arranged in an alternate manner in the planar view, that is in a staggered arrangement, so that the first power semiconductor modules PM11 to PM13 and the second power semiconductor modules PM21 to PM23 face each other in the front and rear directions.

Figure 4:
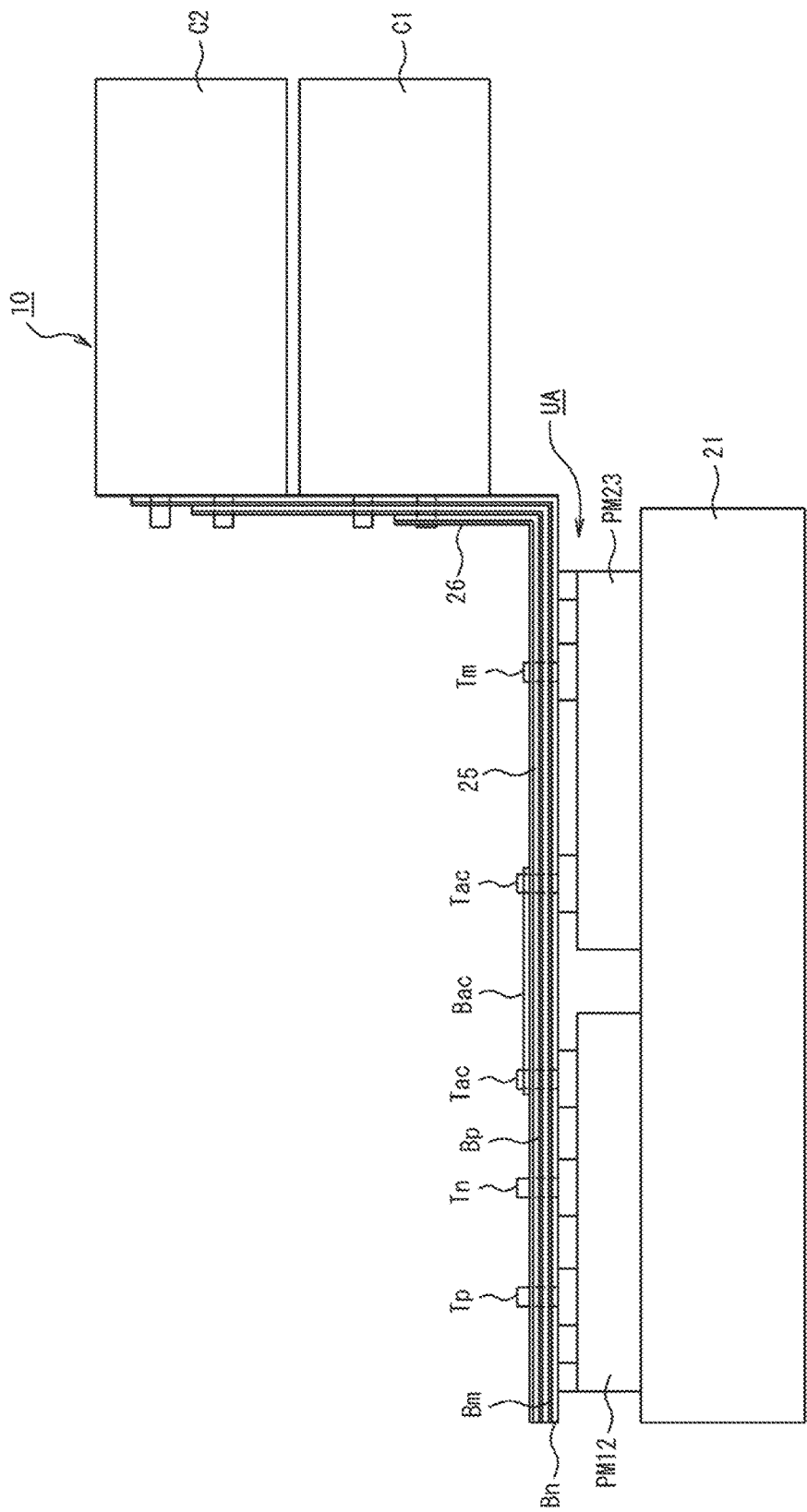
FIG. 4 is a side view of FIG. 2.

As illustrated in FIG. 4, in the U-phase output arm UA, the V-phase output arm VA, and the W-phase output arm WA, the respective terminals Tp, Tn, and Tac of the first power semiconductor modules PM11 to PM13 are electrically connected to a positive electrode bus bar Bp, a negative electrode bus bar Bn, and AC output bus bars Bac, respectively, and the respective terminals Tm and Tac of the second power semiconductor modules PM21 to PM23 are electrically connected to a middle bus bar Bm and the AC output bus bars Bac, respectively.

Figure 5A:
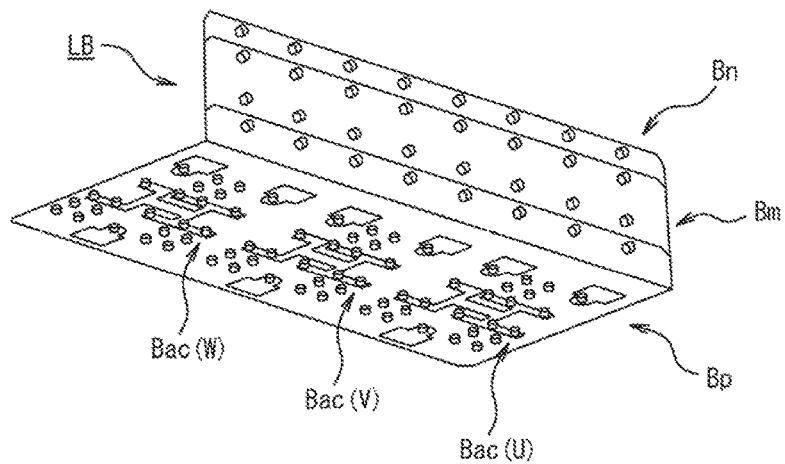
FIGS. 5A and 5B are perspective views illustrative of a laminated bus bar.
Figure 5B:
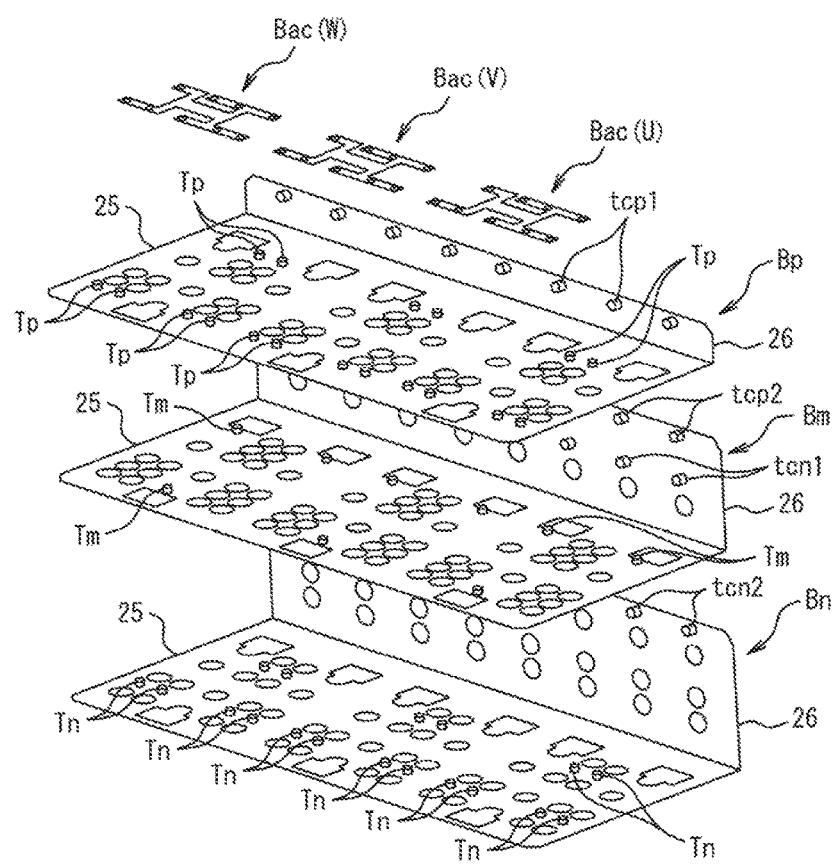

In the above, as illustrated in FIGS. 5A and 5B, each of the positive electrode bus bar Bp, the negative electrode bus bar Bn, and the middle bus bar Bm is constituted with a module connecting flat plate section 25 having such a size as to cover the cooling bodies 21 of the U-phase output arm UA, the V-phase output arm VA, and the W-phase output arm WA and a capacitor connecting bent section 26 bent upward from a rear end section of the module connecting flat plate section 25 to form an L-shape in cross section.

In addition, as illustrated in FIG. 5A, a laminated bus bar LB is constituted by laminating the negative electrode bus bar Bn, the middle bus bar Bm, and the positive electrode bus bar Bp in this order on the U-phase output arm UA, the V-phase output arm VA, and the W-phase output arm WA with an insulating layer, such as an insulating film, interposed between each pair of successive bus bars.

The AC output bus bar Bac is arranged independently for each of three phases, that is, for each of the U-phase output arm UA, the V-phase output arm VA, and the W-phase output arm WA. Each of the AC output bus bars Bac is set to have such a size as to, in the planar view, cover the AC output terminals Tac of the first power semiconductor modules PM11 to PM13 and the second power semiconductor modules PM21 to PM23, which are arranged in a staggered arrangement. The AC output bus bars Bac are laminated on the upper surface of the positive electrode bus bar Bp, which is the top layer, with insulating layers, such as an insulating film, interposed therebetween.

To the positive electrode bus bar Bp, the negative electrode bus bar Bn, and the middle bus bar Bm, through-holes are formed through which the positive electrode terminals Tp, the negative electrode terminals Tn, the AC output terminals Tac, and the middle terminals Tm of the first power semiconductor modules PM11 to PM13 and the second power semiconductor modules PM21 to PM23, which are arranged in a staggered arrangement, are inserted.

In the above, regarding the module connecting flat plate section 25 of the positive electrode bus bar Bp, through-holes that are formed at positions corresponding to the positive electrode terminals Tp of the first power semiconductor modules PM11 to PM13 are set to have such sizes as to allow the positive electrode terminals Tp to fit thereinto and to be electrically connected thereto, and through-holes that are formed at positions corresponding to other terminals are set to have such sizes as to allow the negative electrode terminals Tn, the AC output terminals Tac, and the middle terminals Tm to be inserted therethrough without coming into contact therewith.

Regarding the module connecting flat plate section 25 of the negative electrode bus bar Bn, through-holes that are formed at positions corresponding to the negative electrode terminals Tn of the first power semiconductor modules PM11 to PM13 are set to have such sizes as to allow the negative electrode terminals Tn to fit thereinto and to be electrically connected thereto, and through-holes that are formed at positions corresponding to other terminals are set to have such sizes as to allow the positive electrode terminals Tp, the AC output terminals Tac, and the middle terminals Tm to be inserted therethrough without coming into contact therewith.

Regarding the module connecting flat plate section 25 of the middle bus bar Bm, through-holes that are formed at positions corresponding to the middle terminals Tm of the second power semiconductor modules PM21 to PM23 are set to have such sizes as to allow the middle terminals Tm to fit thereinto and to be electrically connected thereto, and through-holes that are formed at positions corresponding to other terminals are set to have such sizes as to allow the positive electrode terminals Tp, the negative electrode terminals Tn, and the AC output terminals Tac to be inserted therethrough without coming into contact therewith.

Regarding the module connecting flat plate section 25 of the AC output bus bar Bac, through-holes that are formed at positions corresponding to the AC output terminals Tac of the first power semiconductor modules PM11 to PM13 and the second power semiconductor modules PM21 to PM23 are set to have such sizes as to allow the respective AC output terminals Tac to fit thereinto and to be electrically connected thereto.

Furthermore, the capacitor connecting bent sections 26 of the positive electrode bus bar Bp, the middle bus bar Bm, and the negative electrode bus bar Bn are laminated in this order with an insulating layer, such as an insulating film, interposed between each pair of successive bus bars. The capacitor connecting bent sections 26 of the positive electrode bus bar Bp, the middle bus bar Bm, and the negative electrode bus bar Bn are set to have such heights as to become higher in this order.

To the capacitor connecting bent section 26 of the positive electrode bus bar Bp, through-holes which positive electrode terminals tcp1 of a plurality of first capacitors C1, each of which is constituted with, for example, an aluminum electrolytic capacitor, fit into and are electrically connected to are formed.

To the capacitor connecting bent section 26 of the middle bus bar Bm, through-holes which the positive electrode terminals tcp1 of the first capacitors C1 are inserted through without coming into contact with and through-holes which negative electrode terminals tcn1 of the first capacitors C1 and positive electrode terminals tcp2 of a plurality of second capacitors C2, each of which is similarly constituted with, for example, an aluminum electrolytic capacitor, fit into and are electrically connected to are formed.

To the capacitor connecting bent section 26 of the negative electrode bus bar Bn, through-holes which the positive electrode terminals tcp1 and the negative electrode terminals tcn1 of the first capacitors C1 and the positive electrode terminals tcp2 of the second capacitors C2 are inserted through without coming into contact with and through-holes which negative electrode terminals tcn2 of the second capacitors C2 fit into and are electrically connected to are formed.

As described above, electrically interconnecting the positive electrode terminals Tp, the negative electrode terminals Tn, and the AC output terminals Tac of three sets of the first power semiconductor modules PM11 to PM13 using the positive electrode bus bar Bp, the negative electrode bus bar Bn, and the AC output bus bar Bac, respectively, and electrically interconnecting the middle terminals Tm and the AC output terminals Tac of three sets of the second power semiconductor modules PM21 to PM23 using the middle bus bar Bm and the AC output bus bars Bac, respectively, with respect to respective ones of the U-phase output arm UA, the V-phase output arm VA, and the W-phase output arm WA enable the U-phase output arm UA, the V-phase output arm VA, and the W-phase output arm WA illustrated in FIG. 7 to be formed individually.

In the U-phase output arm UA, the V-phase output arm VA, and the W-phase output arm WA, with respect to each arm, the first power semiconductor modules PM11 to PM13 are simultaneously driven by gate signals individually given to the first semiconductor switching elements Q1 and the second semiconductor switching elements Q2, and the second power semiconductor modules PM21 to PM23 are also simultaneously driven by gate signals individually given to the third semiconductor switching elements Q3 and the fourth semiconductor switching elements Q4.

For example, the U-phase output arm UA repeating four operation modes including a first operation mode, a second operation mode, a third operation mode, and a fourth operation mode sequentially causes an AC current to be output to a load.

In the first operation mode, starting from a state in which an output current is 0, the output current is increased to a positive medium current value by switching-controlling the third semiconductor switching elements Q3 in the second power semiconductor modules PM21 to PM23 and next increased to a maximum current value on the positive side and subsequently decreased to the positive medium current value by switching-controlling the first semiconductor switching elements Q1 in the first power semiconductor modules PM11 to PM13.

In the second operation mode, the positive output current is decreased from the positive medium current value to the vicinity of 0 by switching-controlling the third semiconductor switching elements Q3 in the second power semiconductor modules PM21 to PM23, and, when the switching control of the third semiconductor switching elements Q3 is stopped, a flyback current flows to the load side through the flyback diodes D2 of the second semiconductor switching elements Q2 in the first power semiconductor modules PM11 to PM13 and the output current returns to 0.

In the third operation mode, the output current is increased to a negative medium current value by switching-controlling the fourth semiconductor switching elements Q4 in the second power semiconductor modules PM21 to PM23, and next increased to a maximum current value on the negative side and subsequently decreased to the negative medium current value by switching-controlling the second semiconductor switching elements Q2 in the first power semiconductor modules PM11 to PM13.

In the fourth operation mode, the negative output current is decreased from the negative medium current value to the vicinity of 0 by switching-controlling the fourth semiconductor switching elements Q4 in the second power semiconductor modules PM21 to PM23, and, when the switching control of the fourth semiconductor switching elements Q4 is stopped, a flyback current flows to the power source side through the flyback diodes D1 of the first semiconductor switching elements Q1 in the first power semiconductor modules PM11 to PM13 and the output current returns to 0.

Figure 8:
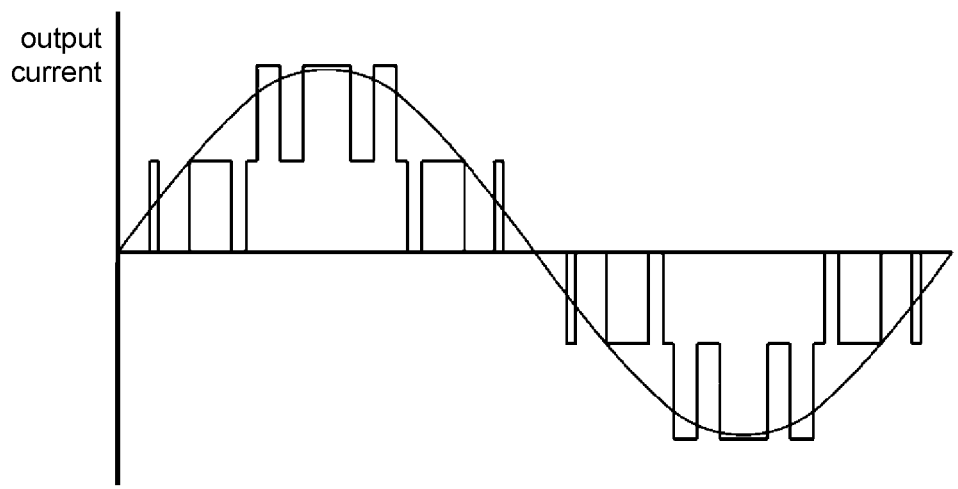
FIG. 8 is a signal waveform chart illustrative of an output current waveform from the U-phase output arm.

As described above, performing the first to fourth operation modes repeatedly enables a three-level AC output current to be formed, as illustrated in FIG. 8.

Performing the same control with phases delayed by 120° and 240° from the phase of the U-phase output arm UA for the V-phase output arm VA and the W-phase output arm WA, respectively, enables a three-level three-phase output current to be output.

Therefore, according to the above-described first embodiment, the first power semiconductor modules PM11 to PM13 and the second power semiconductor modules PM21 to PM23 are arranged in a staggered manner into the recessed sections 21d formed on the module mounting surface 21b of the module mounting plate section 21a of the cooling body 21. Accordingly, for example, the first power semiconductor module PM11 and the second power semiconductor module PM21, which are adjacent to each other, may constitute a U-phase arm set.

Figure 9:
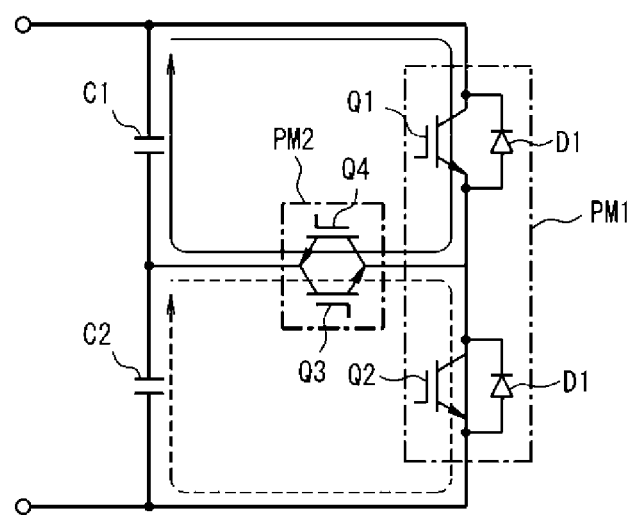
FIG. 9 is a diagram illustrative of current paths in an output arm.

With the above-described configuration, a go-around loop in the switching operation is made up of a path going through the first capacitor C1, the first semiconductor switching element Q1, the fourth semiconductor switching element Q4, and the first capacitor C1 in this order and a path going through the second capacitor C2, the third semiconductor switching element Q3, the second semiconductor switching element Q2, and the second capacitor C2 in this order in an upper arm switching operation and a lower arm switching operation, respectively, as illustrated in FIG. 9. The above-described configuration enables wiring inductance in both paths described above to be decreased, which enables a surge voltage in the turn-off of the semiconductor switching elements Q1 to Q4 and a surge voltage in the reverse recovery of the flyback diodes D1 and D2, which are connected to the semiconductor switching elements Q1 and Q2 in inverse parallel, to be reduced.

In addition, arranging the first power semiconductor modules PM11 to PM13 and the second power semiconductor modules PM21 to PM23 in a staggered manner enables a wiring length between the first power semiconductor module PM13, which serves as a main module, and the first capacitor C1 and second capacitor C2 to be shortest as in, for example, the U-phase output arm UA and the W-phase output arm WA, which, as a consequence, enables wiring inductance to be reduced.

In this connection, when the first power semiconductor modules PM11 to PM13 and the second power semiconductor modules PM21 to PM23 are arranged in the same manner as the conventional art, the second power semiconductor modules PM21 to PM23 are arranged between the first capacitors C1 and second capacitors C2 and the first power semiconductor modules PM11 to PM13, which causes a wiring length between the first capacitors C1 and second capacitors C2 and the first power semiconductor modules PM11 to PM13 to be lengthened by the length of the second power semiconductor modules PM21 to PM23 to increase the wiring inductance.

In addition, when a device power factor is high, the first power semiconductor modules PM11 to PM13, which are arranged in a staggered manner, generate more heat, and, when the device power factor is low, the second power semiconductor modules PM21 to PM23, which are also arranged in a staggered manner, generate more heat. Accordingly, it is possible to keep a long distance between power semiconductor modules that simultaneously generate heat, and dispersing power semiconductor modules generating heat on the cooling body enables a rise in temperature at semiconductor devices that are built in in the power semiconductor modules to be suppressed. Therefore, it is possible to decrease distances between first power semiconductor modules and second power semiconductor modules that are adjacent to each other and to miniaturize the cooling body 21 and, as a consequence, to carry out optimum design.

Although, in the above-described first embodiment, a case in which the first power semiconductor modules PM11 to PM13 and the second power semiconductor modules PM21 to PM23 are arranged in the same staggered arrangement with respect to the U-phase output arm UA, the V-phase output arm VA, and the W-phase output arm WA was described, the arrangement is not limited to the one in the case.

Figure 10:
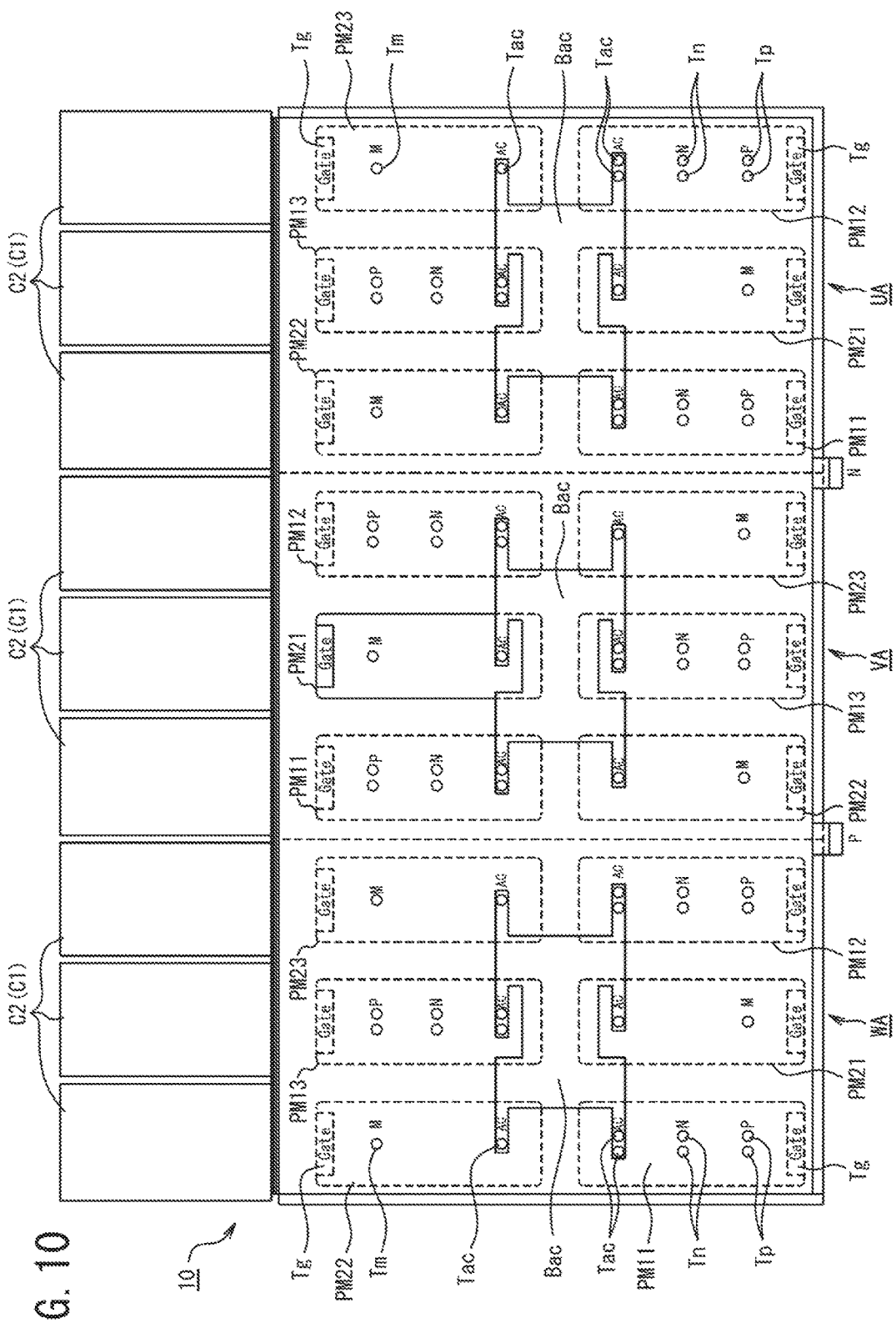
FIG. 10 is a plan view illustrative of a variation of a three-level three-phase power conversion device according to the present invention.

For example, exchanging the front and rear positions between the first module row Mr1 and the second module row Mr2 in the V-phase output arm VA enables, when the U-phase output arm UA, the V-phase output arm VA, and the W-phase output arm WA are aligned, all the first power semiconductor modules PM11 to PM13 and the second power semiconductor modules PM21 to PM23 over the entirety of the output arms to be arranged in a staggered arrangement, as illustrated in FIG. 10.

Although, in the above-described first embodiment, a case in which the present invention is applied to the three-level three-phase power conversion device 10 was described, the present invention is not limited to the case, and the present invention is also applicable to a three-level single-phase power conversion device.

Figure 11:
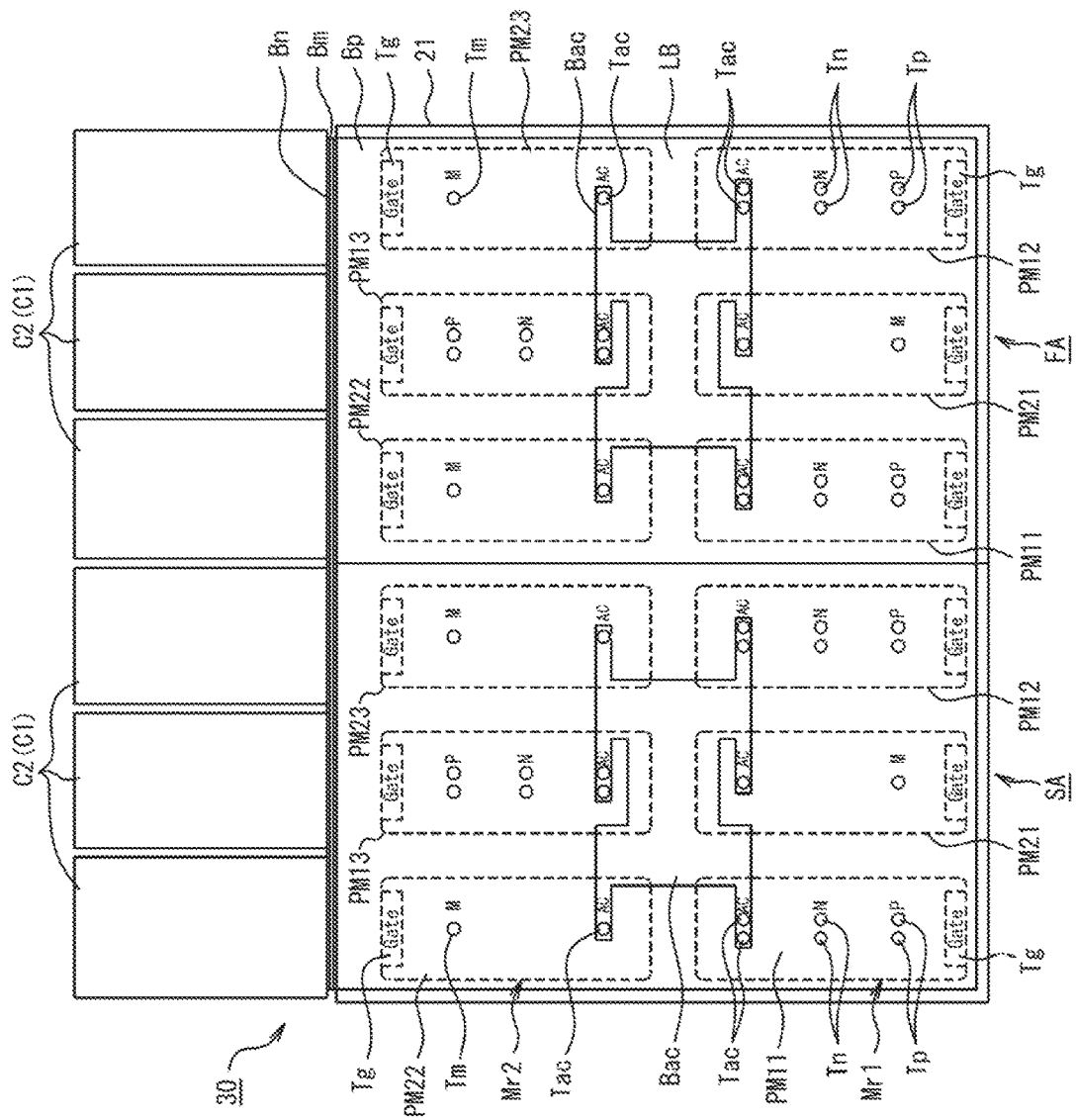
FIG. 11 is a plan view illustrative of a three-level single-phase power conversion device according to the present invention.
Figure 12:
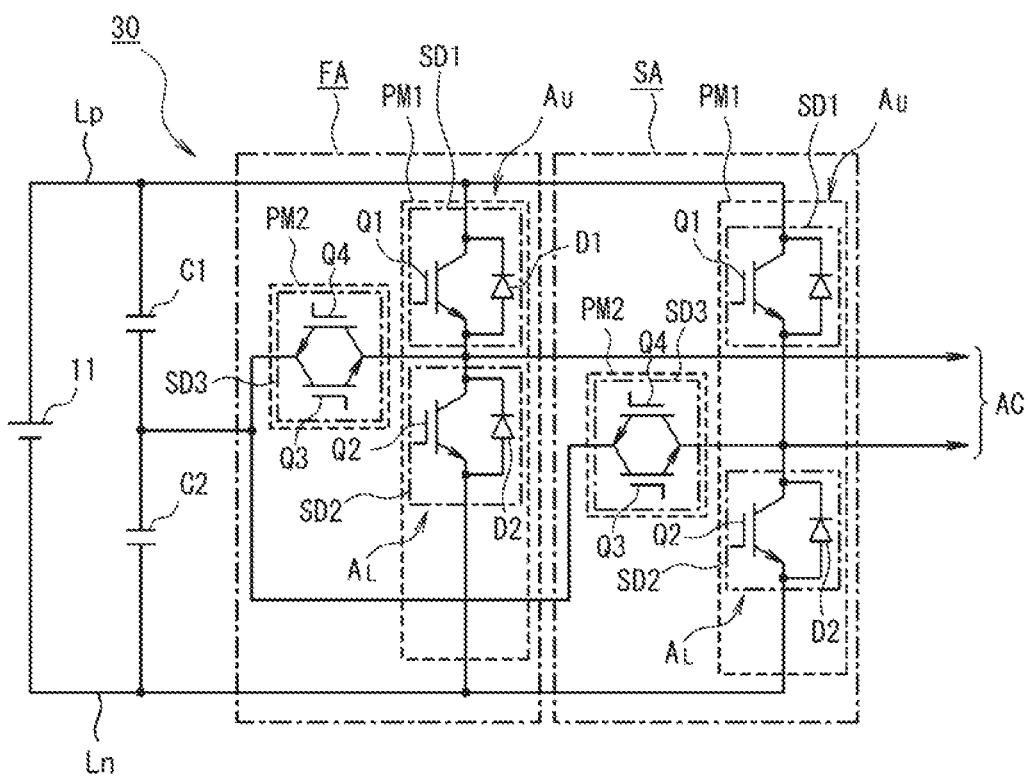
FIG. 12 is a circuit diagram illustrative of an equivalent circuit of FIG. 11.

A three-level single-phase power conversion device 30 described above is achieved by omitting an output arm dealing with any one phase (for example, W-phase) in the afore-described three-level three-phase power conversion device 10, setting, for example, the U-phase output arm UA and the V-phase output arm VA as a first output arm FA and a second output arm SA, respectively, and connecting the two output arm sets in parallel to constitute an H-bridge circuit, as illustrated in FIGS. 11 and 12.

Each of the first output arm FA and the second output arm SA is constituted with a plurality of first power semiconductor modules PM11 to PM13 and a plurality of second power semiconductor modules PM21 to PM23 in the same manner as in the afore-described first embodiment illustrated in FIG. 7.

As illustrated in FIG. 11, in the first output arm FA, on a cooling body 21, the first power semiconductor module PM11, the second power semiconductor module PM21, and the first power semiconductor module PM12 are arranged in this order from the left in the front row and the second power semiconductor module PM22, the first power semiconductor module PM13, and the second power semiconductor module PM23 are arranged in this order from the left in the rear row.

In addition, the first power semiconductor modules PM11 to PM13 and the second power semiconductor modules PM21 to PM23 in the first output arm FA and the second output arm SA are connected by a positive electrode bus bar Bp, a negative electrode bus bar Bn, a middle bus bar Bm, and AC output bus bars Bac.

Even the three-level single-phase power conversion device 30 provides the same operational effects as those of the first embodiment except supplying three-level single-phase AC output in place of three-level three-phase AC output by omitting a circuit dealing with any one phase in the afore-described first embodiment because the arrangement of the first power semiconductor modules PM11 to PM13 and the second power semiconductor modules PM21 to PM23 constituting the first output arm FA and the second output arm SA is the same staggered arrangement as in the first embodiment.

Next, a second embodiment of the power conversion device according to the present invention will be described using FIGS. 13 to 16.

The second embodiment is an embodiment in which snubber circuit built in chips in each of which a snubber circuit is built in are configured to be connected in the afore-described first embodiment.

That is, in the second embodiment, a snubber circuit built in chip 31 in which a snubber circuit is built in is connected between each pair of a first power semiconductor module PM1 and a second power semiconductor module PM2 that are adjacent to each other in the arrangement direction with respect to each of a U-phase output arm UA, a V-phase output arm VA, and a W-phase output arm WA. In the second embodiment, description will be made using the V-phase output arm VA as an example.

Figure 13:
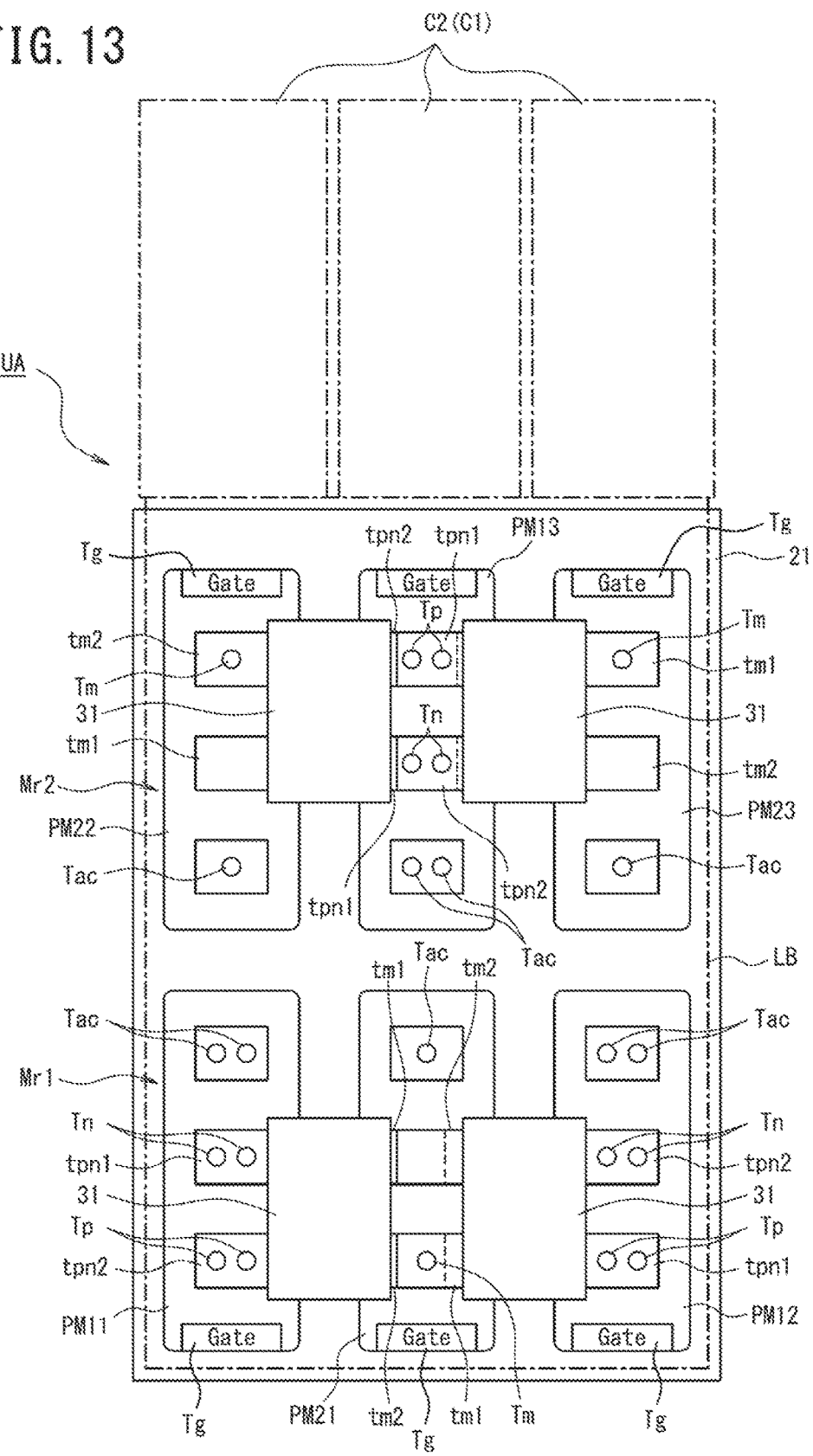
FIG. 13 is a plan view illustrative of a portion corresponding to one phase of a second embodiment of the power conversion device according to the present invention.

The snubber circuit built in chip 31 is a four-terminal semiconductor chip and includes a first positive/negative electrode terminal tpn1, a second positive/negative electrode terminal tpn2, a first middle terminal tm1, and a second middle terminal tm2, as illustrated in FIG. 13. The first positive/negative electrode terminal tpn1 is electrically connected to one of positive electrode terminals Tp and negative electrode terminals Tn of a first power semiconductor module PM1. The second positive/negative electrode terminal tpn2 is electrically connected to the other of the positive electrode terminals Tp and the negative electrode terminals Tn of the first power semiconductor module PM1. Either the first middle terminal tm1 or the second middle terminal tm2 is electrically connected to a middle terminal Tm of a second power semiconductor module PM2.

Figure 14:
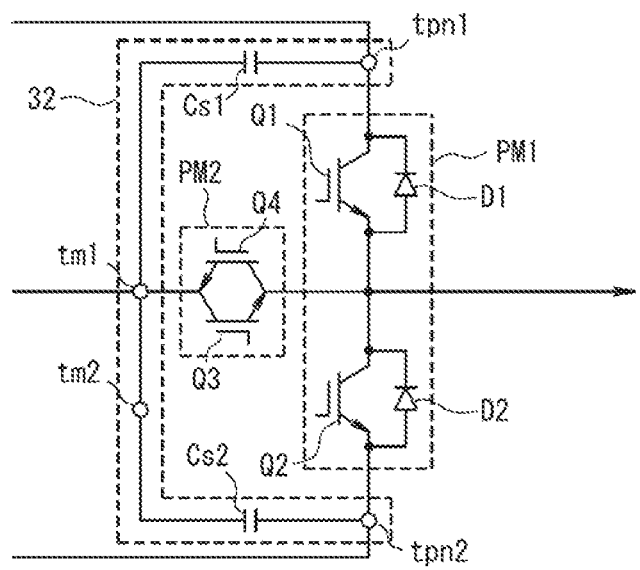
FIG. 14 is a circuit diagram illustrative of a C snubber circuit that is applicable to the second embodiment.
Figure 15:
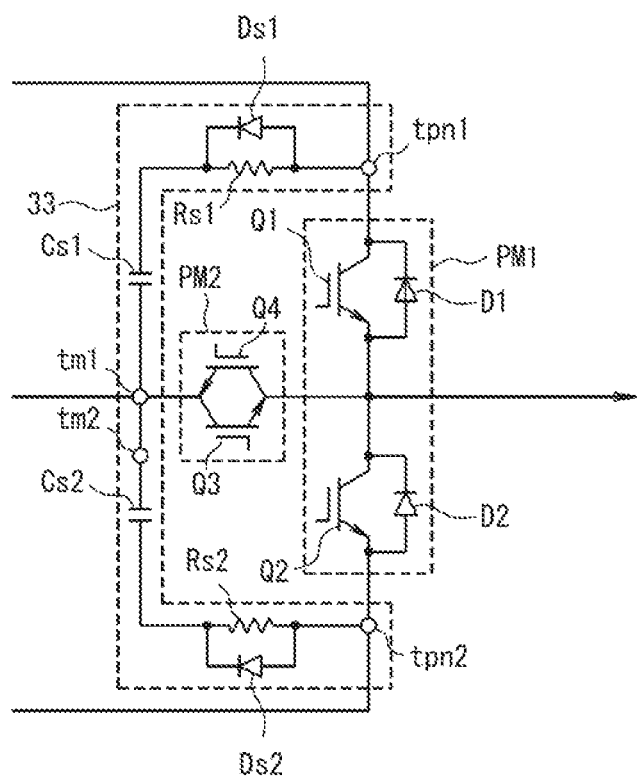
FIG. 15 is a circuit diagram illustrative of an RCD snubber circuit that is applicable to the second embodiment.

Although, as a snubber circuit that is built in in the snubber circuit built in chip 31, a C snubber circuit 32 illustrated in FIG. 14 and a RCD snubber circuit 33 illustrated in FIG. 15 are applicable, the snubber circuit is not limited to a C snubber circuit and an RCD snubber circuit and other various types of snubber circuits are applicable.

As illustrated in FIG. 14, the C snubber circuit 32 includes a first snubber capacitor Cs1 that is connected between the first positive/negative electrode terminal tpn1 and the first middle terminal tm1 and a second snubber capacitor Cs2 that is connected between the second positive/negative electrode terminal tpn2 and the second middle terminal tm2. In addition, the first middle terminal tm1 and the second middle terminal tm2 of the C snubber circuit 32 are electrically interconnected directly.

As illustrated in FIG. 15, the RCD snubber circuit 33 includes a first snubber capacitor Cs1 and a first snubber resistor Rs1 that are connected in series between the first positive/negative electrode terminal tpn1 and the first middle terminal tm1 and a first snubber diode Ds1 that is connected in parallel with the first snubber resistor Rs1. The anode and cathode of the first snubber diode Ds1 are connected to a connection point between the first positive/negative electrode terminal tpn1 and the first snubber resistor Rs1 and a connection point between the first snubber resistor Rs1 and the first snubber capacitor Cs1, respectively.

The RCD snubber circuit 33 also includes a second snubber capacitor Cs2 and a second snubber resistor Rs2 that are connected in series between the second positive/negative electrode terminal tpn2 and the second middle terminal tm2 and a second snubber diode Ds2 that is connected in parallel with the second snubber resistor Rs2. The anode and cathode of the second snubber diode Ds2 are connected to a connection point between the second positive/negative electrode terminal tpn2 and the second snubber resistor Rs2 and a connection point between the second snubber resistor Rs2 and the second snubber capacitor Cs2, respectively.

Furthermore, the first middle terminal tm1 and the second middle terminal tm2 of the RCD snubber circuit 33 are electrically interconnected directly.

As illustrated in FIG. 13, four snubber circuit built in chip 31 are connected among first power semiconductor modules PM11 to PM13 and second power semiconductor modules PM21 to PM23 constituting the V-phase output arm VA by, for example, soldering.

That is, between the first power semiconductor module PM11 and the second power semiconductor module PM21, a snubber circuit built in chip 31 is connected with its first positive/negative electrode terminal tpn1, second positive/negative electrode terminal tpn2, and second middle terminal tm2 electrically connected to negative electrode terminals Tn of the first power semiconductor module PM11, positive electrode terminals Tp of the first power semiconductor module PM11, and a middle terminal Tm of the second power semiconductor module PM21, respectively. The second middle terminal tm2 is put in a non-connection state.

In a similar manner, between the first power semiconductor module PM12 and the second power semiconductor module PM21, a snubber circuit built in chip 31 is connected with its first positive/negative electrode terminal tpn1, second positive/negative electrode terminal tpn2, and first middle terminal tm1 electrically connected to positive electrode terminals Tp of the first power semiconductor module PM12, negative electrode terminals Tn of the first power semiconductor module PM12, and a middle terminal Tm of the second power semiconductor module PM21, respectively. The second middle terminal tm2 is placed on the second middle terminal tm2 of the adjacent snubber circuit built in chip 31 with an insulating member interposed therebetween to be put in a non-connection state.

In addition, between the first power semiconductor module PM13 and the second power semiconductor module PM22, a snubber circuit built in chip 31 is connected with its first positive/negative electrode terminal tpn1, second positive/negative electrode terminal tpn2, and second middle terminal tm2 electrically connected to negative electrode terminals Tn of the first power semiconductor module PM13, positive electrode terminals Tp of the first power semiconductor module PM13, and a middle terminal Tm of the second power semiconductor module PM22, respectively. The first middle terminal tm1 is put in a non-connection state.

Furthermore, between the first power semiconductor module PM13 and the second power semiconductor module PM23, a snubber circuit built in chip 31 is connected with its first positive/negative electrode terminal tpn1, second positive/negative electrode terminal tpn2, and first middle terminal tm1 electrically connected to the positive electrode terminals Tp of the first power semiconductor module PM13, the negative electrode terminals Tn of the first power semiconductor module PM13, and the middle terminal Tm of the second power semiconductor module PM23, respectively. The second middle terminal tm2 is put in a non-connection state.

According to the second embodiment, as with the afore-described first embodiment, the first power semiconductor modules PM11 to PM13 and the second power semiconductor modules PM21 to PM23 are arranged in a staggered arrangement on a cooling body 21. Thus, in a first module row Mr1, the first power semiconductor module PM11, the second power semiconductor module PM21, and the first power semiconductor module PM12 are aligned in order with side surfaces of each pair of adjacent modules facing each other. In a second module row Mr2, the second power semiconductor module PM22, the first power semiconductor module PM13, and the second power semiconductor module PM23 are aligned in order with side surfaces of each pair of adjacent modules facing each other.

Each snubber circuit built in chip 31 is constituted into a four-terminal chip including a first positive/negative electrode terminal tpn1, a second positive/negative electrode terminal tpn2, a first middle terminal tm1, and a second middle terminal tm2.

Therefore, in addition to the advantageous effects of the first embodiment, the second embodiment enables a mounting area on which the snubber circuit built in chip 31 is mounted to be secured between a first power semiconductor module PM1 and a second power semiconductor module PM2 that are adjacent to each other. In addition, wiring distances between a snubber circuit built in chip 31 and a first power semiconductor module PM1 and second power semiconductor module PM2 may be set at a shortest distance to reduce wiring inductance. For this reason, the configuration of a three-level power conversion device may be miniaturized and, in conjunction therewith, the efficiency thereof may be increased.

Figure 16:
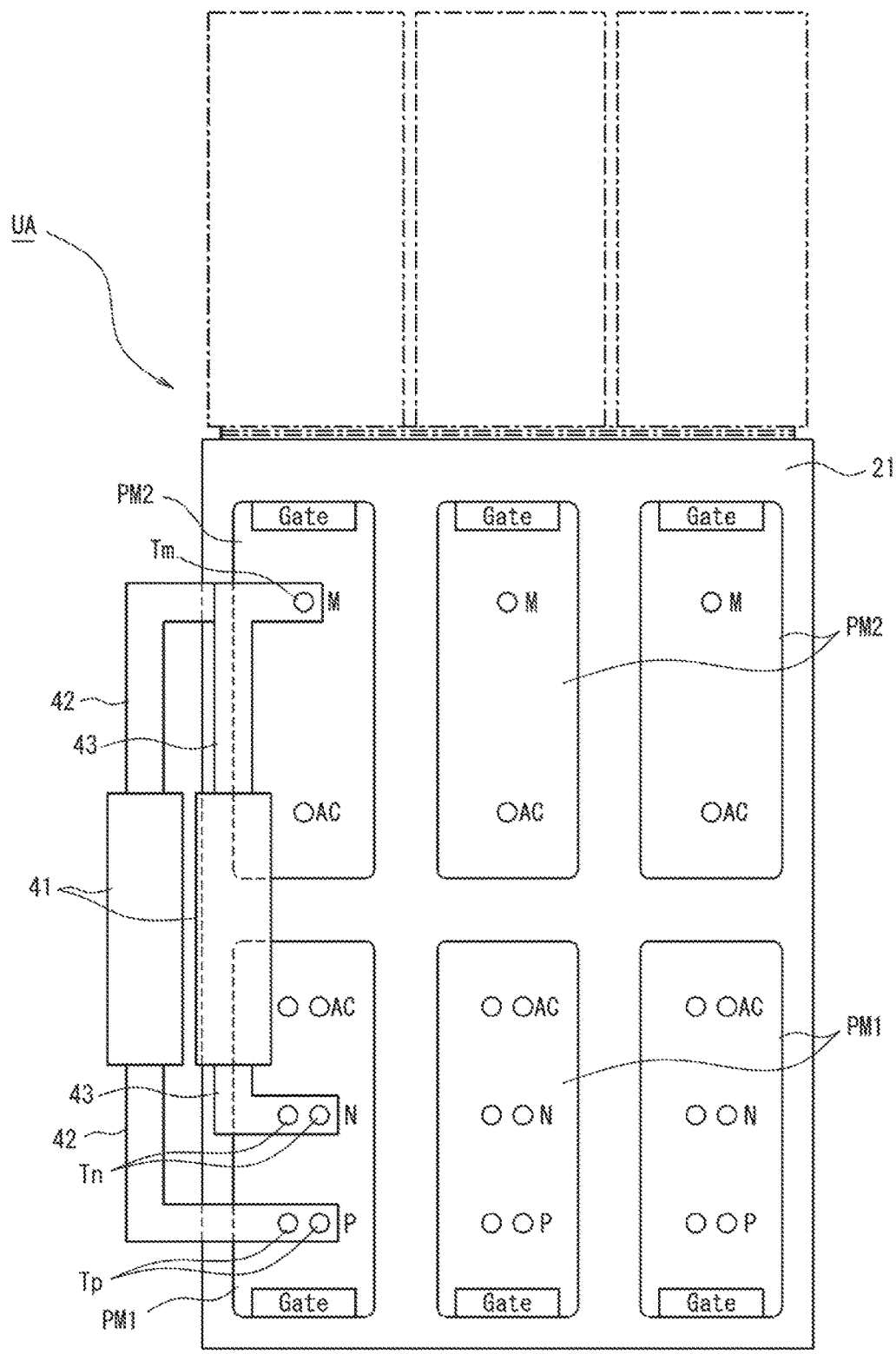
FIG. 16 is a plan view when a snubber circuit built in chip is applied to a conventional art.

In this connection, when the first power semiconductor modules PM1 and the second power semiconductor modules PM2 are arranged in separation as in the conventional art, a snubber circuit built in chip with four terminals is inapplicable in connecting a snubber circuit built in chip, and it is required to arrange two snubber circuit built in chips 41 with two terminals in parallel and to connect the snubber circuit built in chips 41 between a first power semiconductor module PM1 and a second power semiconductor module PM2 using bus bars 42 and 43, as illustrated in FIG. 16.

In other words, it is required to connect the snubber circuit built in chips 41 between positions having a longest distance, that is, an outer side position of a first power semiconductor module PM1 and an outer side position of a second power semiconductor module PM2, and between positions having a second longest distance, that is, a middle position of the first power semiconductor module PM1 and the outer side position of the second power semiconductor module PM2, via the bus bars 42 and 43, respectively. Thus, the size of a mounting area for the snubber circuit built in chips 41 increases, which causes the miniaturization of a three-level power conversion device to be difficult. In addition, there is a problem in that an increase in wiring parasitic inductance causes surge voltage suppression by a snubber circuit to be difficult to work and reducing element loss by means of speeding up of a switching operation to be difficult, which causes increasing the efficiency of a three-level power conversion device to be difficult.

On the other hand, in the above-described second embodiment, it is possible to arrange a snubber circuit built in chip between a first power semiconductor module PM1 and a second power semiconductor module PM2 that are adjacent and arranged in parallel to each other, which enables the above-described problem in the conventional art to be solved.

Although the first and second embodiments of the present invention have been described above, the present invention is not limited to the embodiments and can be subjected to a variety of alterations and improvements.

For example, an arrangement between the first power semiconductor modules PM11 to PM13 and the second power semiconductor modules PM21 to PM23 in the U-phase output arm UA and W-phase output arm WA and the V-phase output arm VA may be changed into a reverse arrangement by exchanging the front and rear positions between the first module row Mr1 and second module row Mr2.

To semiconductor switching elements Q1 to Q4 that are built in in a first power semiconductor module PM1 and a second power semiconductor module PM2, not only IGBTs but also MOSFETs are applicable and, in conjunction therewith, without being limited to a case in which the switching elements Q1 to Q4 are constituted with Si, at least a portion of the semiconductor switching elements may be constituted with power semiconductor devices that are made of wide band gap semiconductors, such as SiC, GaN, and the like.

Figure 17:
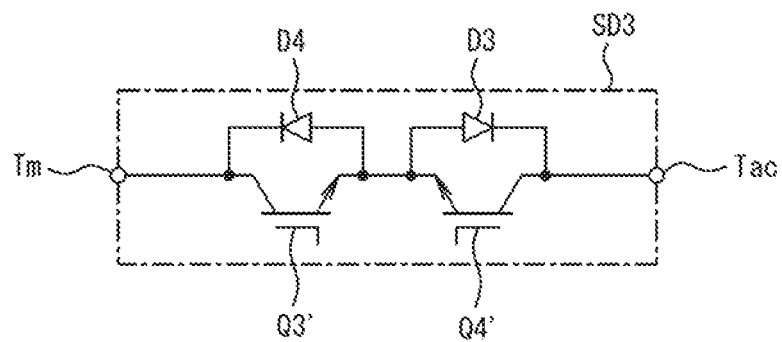
FIG. 17 is a circuit diagram illustrative of a variation of a second power semiconductor module.

Without being limited to a case of being constituted with reverse blocking semiconductor switching elements Q3 and Q4, a bidirectional semiconductor device SD3 that is built in in the second power semiconductor module PM2 may be constituted with a series circuit of a bidirectional semiconductor switching element Q3' and a diode D3 and a series circuit, which is connected in parallel with the above series circuit, of a bidirectional semiconductor switching element Q4' and a diode D4, as illustrated in FIG. 17. In this case, the bidirectional semiconductor switching element Q3' and the diode D4 are connected in parallel, and the bidirectional semiconductor switching element Q4' and the diode D3 are connected in parallel.

The number of pairs of a first power semiconductor module PM1 and a second power semiconductor module PM2 constituting an output arm is not limited to three and may be set at two or four or more.

The laminated bus bar LB needs not be formed over a plurality of phases as in the above-described embodiments and may be constituted in a divided manner with respect to each phase. Without being limited to a case of being formed in a flat plate shape, the positive electrode bus bar Bp, the middle bus bar Bm, and the negative electrode bus bar Bn constituting the laminated bus bar LB may be formed in a lattice shape or in a strip shape with respect to each phase.

The present invention is not limited to a three-level power conversion device, and may be applied to another multilevel, four or more levels, power conversion device having output arms each constituted with a first power semiconductor module PM1 and a second power semiconductor module PM2 in combination.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

REFERENCE SIGNS LIST

10 Three-level three-phase power conversion device
UA U-phase output arm
VA V-phase output arm
WA W-phase output arm
PM1, PM11 to PM13 First power semiconductor module
PM2, PM21 to PM23 Second power semiconductor module
  Tp Positive electrode terminal
  Tn Negative electrode terminal
  Tac Output terminal
  Tm Middle terminal
  21 Cooling body
  Mr1 First module row
  Mr2 Second module row
  Bp Positive electrode bus bar
  Bn Negative electrode bus bar
  Bm Middle bus bar
  Bac AC output bus bar
  25 Module connecting flat plate section
  26 Capacitor connecting bent section
  C1 First capacitor
  C2 Second capacitor
  30 Three-level single-phase power conversion device
  31 Snubber circuit built in chip
  tpn1 First positive/negative electrode terminal
  tpn2 Second positive/negative electrode terminal
  tm1 First middle terminal
  tm2 Second middle terminal
  32 C snubber circuit
  33 RCD snubber circuit

The invention claimed is:

1. A power conversion device comprising:
a capacitor series circuit of a first capacitor and a second capacitor connected in series with a DC power source;
a plurality of first power semiconductor modules in each of which a series circuit of a first semiconductor device and a second semiconductor device is built in, each of the plurality of first power semiconductor modules being connected in parallel with the capacitor series circuit; and
a plurality of second power semiconductor modules in each of which a bidirectional semiconductor device is built in, the bidirectional semiconductor device of each of the plurality of second power semiconductor modules being connected between a connection point between the first capacitor and the second capacitor and a connection point between the first semiconductor device of a respective first semiconductor module among the plurality of the first power semiconductor modules and the second semiconductor device of the respective first power semiconductor module,
wherein the plurality of first power semiconductor modules and the plurality of second power semiconductor modules are arranged on a mounting surface of a cooling body in a staggered arrangement in which the plurality of first power semiconductor modules are interspersed with the plurality of second power semiconductor modules.

2. The power conversion device according to claim 1, wherein
in each of the plurality of first power semiconductor modules, a positive electrode terminal, a negative electrode terminal, and an external connection terminal are arranged in order on an identical terminal arrangement surface, and
in each of the plurality of second power semiconductor modules, an external connection terminal that is connected to the external connection terminal of the respective first power semiconductor module and a middle connection terminal that is connected to a connection point between the first capacitor and the second capacitor are arranged on an identical terminal arrangement surface.

3. The power conversion device according to claim 1, wherein
the plurality of first power semiconductor modules and the plurality of second power semiconductor modules are arranged on the mounting surface of the cooling body in a first module row and a second module row,
in the first module row, one or more of the plurality of first power semiconductor modules and one or more of the plurality of second power semiconductor modules are aligned alternately,
each of one or more of the plurality of first power semiconductor modules arranged in the first module row is positioned across from a respective one of the plurality of second power semiconductor modules arranged in the second module row, and
each of one or more of the plurality of second power semiconductor modules arranged in the first module row is positioned across from a respective one of the plurality of first power semiconductor modules arranged in the second module row.

4. The power conversion device according to claim 3, wherein
in the first module row, the plurality of first power semiconductor modules and the plurality second power semiconductor modules have external connection terminals aligned on one end side, and
in the second module row, the plurality of first power semiconductor modules and the plurality of second power semiconductor modules have external connection terminals aligned on one end side and facing the external connection terminals in the first module row.

5. The power conversion device according to claim 3, further comprising:
a positive electrode bus bar configured to connect the positive electrode terminals in the first module row and the second module row to one another;
a negative electrode bus bar configured to connect the negative electrode terminals in the first module row and the second module row to one another;
a middle bus bar configured to connect the middle connection terminals in the first module row and the second module row to one another; and
output bus bars configured to connect output terminals facing each other in the first module row and the second module row to each other individually.

6. The power conversion device according to claim 5, wherein
the positive electrode bus bar, the negative electrode bus bar, and the middle bus bar are constituted with a laminated bus bar.

7. The power conversion device according to claim 3, comprising:
a snubber circuit built in chip in which a snubber circuit is built in, the snubber circuit being connected between a positive electrode terminal and a negative electrode terminal of one of the plurality of first power semiconductor modules and a middle connection terminal of a second power semiconductor module, which is one of the plurality of second power semiconductor modules and is adjacent to the one of the plurality of first power semiconductor modules whose negative electrode terminal is connected to the snubber circuit.

8. The power conversion device according to claim 1, comprising:
a three-level three-phase inverter constituted by connecting three output arms, each of the output arms including at least one of the plurality of first power semiconductor modules and at least one of the plurality of second power semiconductor modules.

9. The power conversion device according to claim 8, wherein
each of the output arms is constituted by connecting a the plurality of first power semiconductor modules in parallel and connecting the plurality of second power semiconductor modules in parallel.

10. The power conversion device according to claim 1, wherein
at least one device among the respective first semiconductor devices of the plurality of first power semiconductor modules, the respective second semiconductor devices of the plurality of first power semiconductor modules, and the respective bidirectional semiconductor devices of the plurality of second power semiconductor modules is constituted including a wide band gap semiconductor element.

11. The power conversion device according to claim 1, wherein, on the mounting surface of the cooling body,
one of the plurality of first power semiconductor modules is interposed between two of the plurality of second power semiconductor modules, and
one of the plurality of second power semiconductor modules is interposed between two of the plurality of first power semiconductor modules.

12. The power conversion device according to claim 1, wherein
the plurality of first power semiconductor modules comprises two first power semiconductor modules and the plurality of second power semiconductor modules comprises two second power semiconductor modules, and
the two first power semiconductor modules are interspersed with the two second power semiconductor modules by being in a 2×2 arrangement in which the two first power semiconductor modules occupy one set of diagonal positions in the 2×2 arrangement and the two second power semiconductor modules occupy another set of diagonal positions in the 2×2 arrangement.

\* \* \* \* \*

UNITED STATES PATENT AND TRADEMARK OFFICE
CERTIFICATE OF CORRECTION

PATENT NO. : 10,186,980 B2
APPLICATION NO. : 15/712592
DATED : January 22, 2019
INVENTOR(S) : Yasunobu Kadota et al.

It is certified that error appears in the above-identified patent and that said Letters Patent is hereby corrected as shown below:

In the Claims

In Column 18, Line 8, In Claim 9, delete "a the" and insert -- the --, therefor.

Signed and Sealed this
Second Day of April, 2019

Andrei Iancu
*Director of the United States Patent and Trademark Office*